(12) United States Patent
Salter et al.

(10) Patent No.: US 10,950,753 B2
(45) Date of Patent: Mar. 16, 2021

(54) LIGHTING ASSEMBLY

(71) Applicant: Ford Global Technologies, LLC, Dearborn, MI (US)

(72) Inventors: Stuart C. Salter, White Lake, MI (US); Paul Kenneth Dellock, Northville, MI (US); Thorsten Warwel, Duisburg (DE); Harry Lobo, Canton, MI (US); David A. Brown, Plymouth, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 16/358,748

(22) Filed: Mar. 20, 2019

(65) Prior Publication Data

US 2020/0303589 A1 Sep. 24, 2020

(51) Int. Cl.
| | |
|---|---|
| *H01L 33/26* | (2010.01) |
| *B60Q 1/26* | (2006.01) |
| *B60Q 1/50* | (2006.01) |
| *H01L 33/00* | (2010.01) |
| *H01L 33/42* | (2010.01) |
| *H01L 33/56* | (2010.01) |
| *B29C 45/14* | (2006.01) |
| *B29K 33/04* | (2006.01) |
| *B29L 31/30* | (2006.01) |
| *G05D 1/02* | (2020.01) |

(52) U.S. Cl.
CPC ........... *H01L 33/26* (2013.01); *B60Q 1/2611* (2013.01); *B60Q 1/2696* (2013.01); *B60Q 1/50* (2013.01); *H01L 33/005* (2013.01); *H01L 33/42* (2013.01); *H01L 33/56* (2013.01); *B29C 45/14819* (2013.01); *B29K 2033/04* (2013.01); *B29L 2031/30* (2013.01); *B60Q 2400/10* (2013.01); *G05D 1/021* (2013.01); *H01L 2933/005* (2013.01); *H01L 2933/0016* (2013.01)

(58) Field of Classification Search
CPC combination set(s) only.
See application file for complete search history.

(56) References Cited

U.S. PATENT DOCUMENTS

| | | | |
|---|---|---|---|
| 9,290,123 B2 | 3/2016 | Salter et al. | |
| 9,419,174 B2 | 8/2016 | Zheng et al. | |
| 10,118,538 B2 | 11/2018 | Salter et al. | |
| 2013/0101822 A1* | 4/2013 | Kunal | B32B 27/365 428/219 |
| 2015/0323149 A1* | 11/2015 | Salter | F21S 43/26 362/510 |
| 2015/0375677 A1* | 12/2015 | Salter | B60Q 3/283 362/510 |
| 2017/0334342 A1 | 11/2017 | Dellock et al. | |

(Continued)

*Primary Examiner* — Moin M Rahman
(74) *Attorney, Agent, or Firm* — David Coppiellie; Price Heneveld LLP (57) ABSTRACT

A lighting assembly for a vehicle includes a polymeric layer and a first conductive layer coupled to the polymeric layer. A first metallic foil defined a plurality of first foil apertures. A semiconductor layer includes a plurality of perovskites. A second conductive layer is coupled to the semiconductor layer. A second metallic foil defines a plurality of second foil apertures. The lighting assembly includes transparent overmold, extending through the plurality of first foil apertures, the first and second conductive layers, the semiconductor layer, and the plurality of second foil apertures to contact the polymeric layer.

15 Claims, 6 Drawing Sheets

(56) References Cited

U.S. PATENT DOCUMENTS

2018/0239187 A1* 8/2018 Hirakata ................. B32B 23/20
2018/0258900 A1* 9/2018 Namuduri ............. F02N 15/067
2020/0156532 A1* 5/2020 Lee ..................... B60Q 1/0023

* cited by examiner

LIGHTING ASSEMBLY

FIELD OF THE DISCLOSURE

The present disclosure generally relates to a lighting assembly. More specifically, the present disclosure relates to a lighting assembly for a vehicle.

BACKGROUND OF THE DISCLOSURE

Conventional vehicle light sources may require more depth than is available on a vehicle or may not be manufactured in long strips. Perovskite based light sources may include conductors that may not withstand thermal cycling. Accordingly, new lighting designs, which utilize perovskite based semiconductor light sources that can withstand thermal cycling, may be advantageous.

SUMMARY OF THE DISCLOSURE

According to at least one aspect of the present disclosure, a lighting assembly for a vehicle includes a polymeric layer and a first conductive layer coupled to the polymeric layer. A first metallic foil defined a plurality of first foil apertures. A semiconductor layer includes a plurality of perovskites. A second conductive layer is coupled to the semiconductor layer. A second metallic foil defines a plurality of second foil apertures. The lighting assembly includes transparent overmold, extending through the plurality of first foil apertures, the first and second conductive layers, the semiconductor layer, and the plurality of second foil apertures to contact the polymeric layer.

According to another aspect of the present disclosure, a vehicle lighting system includes a vehicle control module configured to operate a vehicle in an economist driving state. A controller is configured to activate a light source in response to the autonomous driving state. A lighting assembly includes a polymeric layer and a semiconductor layer configured to emit light. The semiconductor layer is positioned between first and second conductive layers. The lighting assembly includes a metallic foil defining a plurality of foil aperture and an overmold, wherein the overmold extends through the plurality of foil apertures, the semiconductor layer, and the first and second conductive layers to contact the polymeric layer.

According to another aspect of the present disclosure, a method of manufacturing a lighting assembly for a vehicle includes extruding a first metallic foil and a second metallic foil. The method includes printing a polymeric layer and coupling the first and second metallic foils to the polymeric layer. A next step of printing a semiconductor layer on the first conductive layer, wherein the semiconductor includes a plurality of perovskites. A step of printing a dielectric layer on the semiconductor layer and through an opening defined by the first and second metallic foils. A step of printing a second conductive layer on the dielectric layer and over outer end portions of the dielectric layer. The method includes a step of molding an overmold over the second conductive layer.

These and other aspects, objects, and features of the present disclosure will be understood and appreciated by those skilled in the art upon studying the following specification, claims, and appended drawings.

BRIEF DESCRIPTION OF THE DRAWINGS

The following is a description of the figures in the accompanying drawings. The figures are not necessarily to scale, and certain features and certain views of the figures may be shown exaggerated in scale or in schematic in the interest of clarity and conciseness.

In the drawings.

DETAILED DESCRIPTION OF THE PREFERRED EMBODIMENTS

Additional features and advantages of the invention will be set forth in the detailed description which follows and will be apparent to those skilled in the art from the description, or recognized by practicing the invention as described in the following description, together with the claims and appended drawings.

Figure 1:
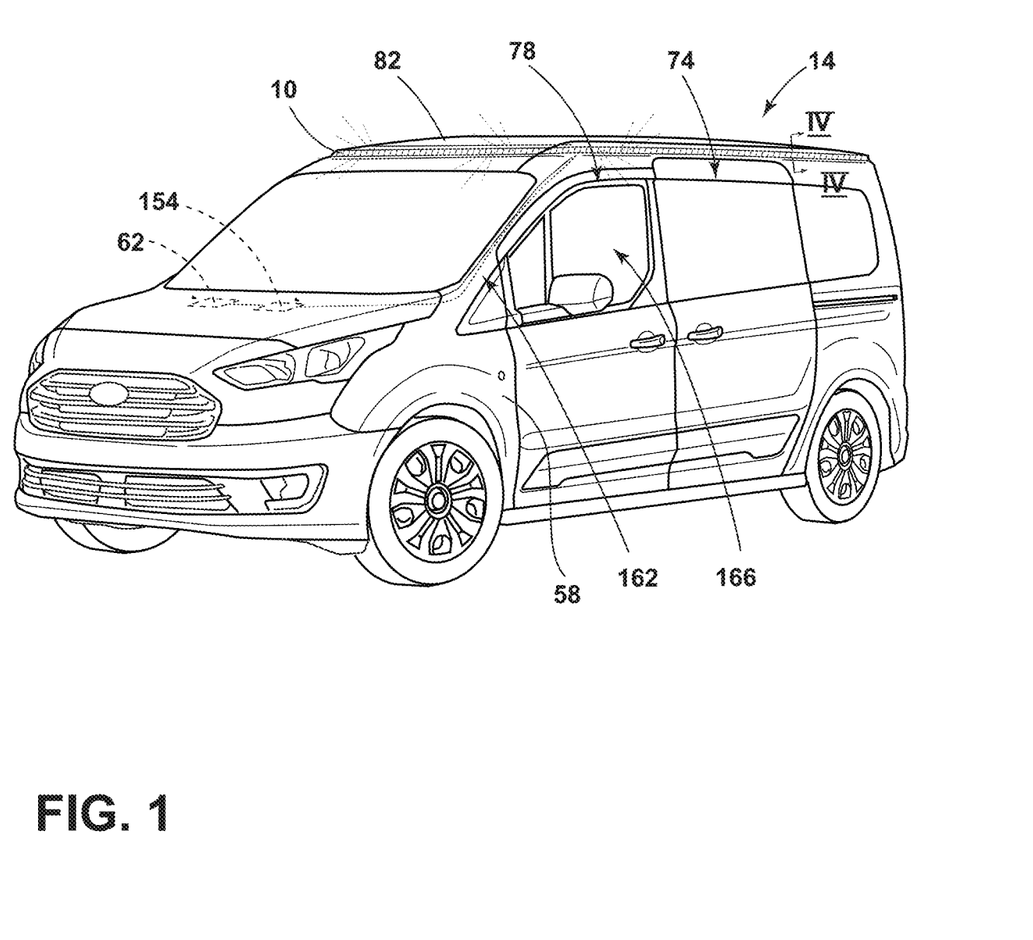
FIG. 1 is a side perspective view of a vehicle having a lighting assembly, according to one example.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 2:
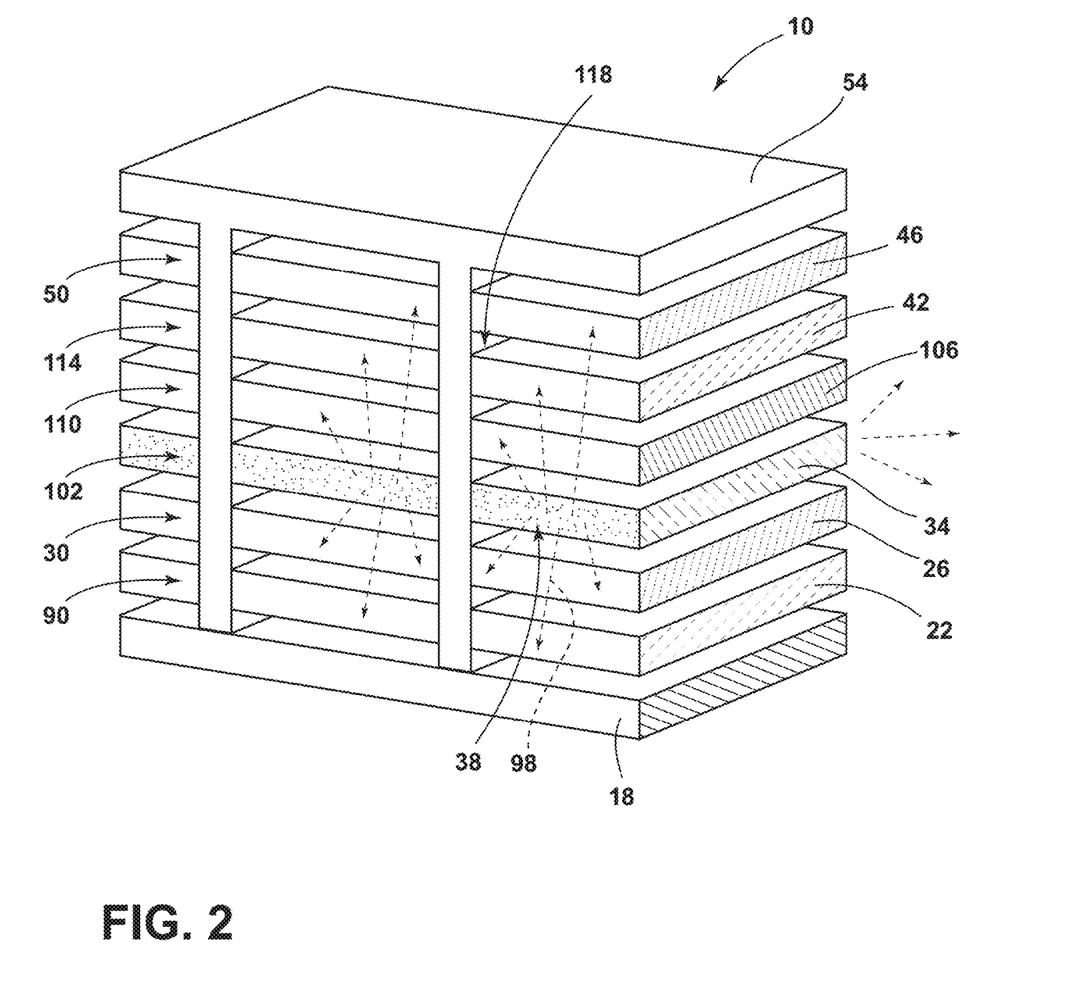
FIG. 2 is an exploded view of a lighting element of the lighting assembly of FIG. 1, according to one example.
Figure 3:
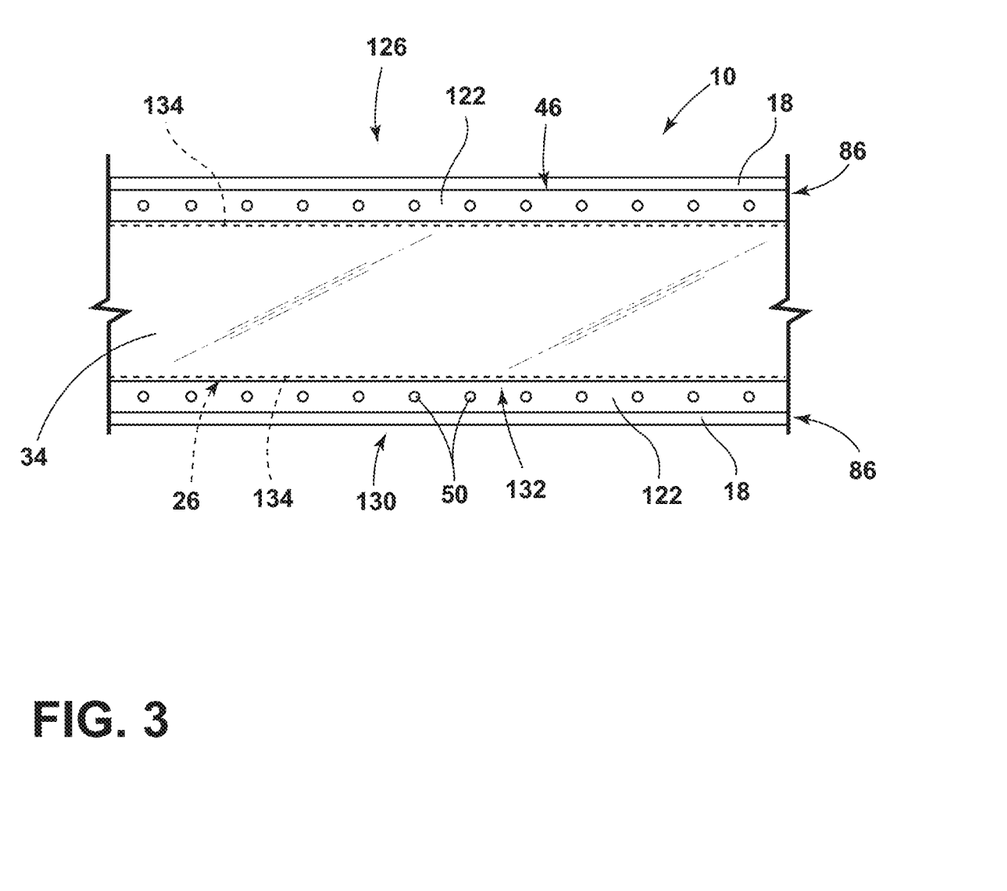
FIG. 3 is a partial top view of the lighting assembly of FIG. 1, according to one example.

Referring to FIGS. 1-3, reference numeral 10 generally designates a lighting assembly for a vehicle 14, which includes a polymeric layer 18 and a first conductive layer 22 coupled to the polymeric layer 18. A first metallic foil 26 defines a plurality of first foil apertures 30. A first conductive layer 22 is coupled to the first metallic foil 26. The lighting assembly 10 includes a semiconductor layer 34 including a plurality of perovskites 38. A second conductive layer 42 is coupled to the semiconductor layer 34. A second metallic foil 46 defines a plurality of second foil apertures 50. The lighting assembly 10 includes an overmold 54. The overmold 54 extends through the plurality of first foil apertures 30, the first and second conductive layers 22, 42, the semiconductor layer 34, and the plurality of second foil apertures 50 to contact the polymeric layer 18. The overmold 54 may be advantageous to provide a lens and/or the structure for the lighting assembly 10.

Referring to FIG. 1, the vehicle 14 is depicted including the lighting assembly 10. The vehicle 14 may be a wheeled motor vehicle and is illustrated as a van, but it is understood that the vehicle 14 may be a sedan, truck, sports utility vehicle, cross-over, or other type of vehicle without departing from the teachings herein. In various examples, a body 58 of the vehicle 14 may be formed from steel, which has a coefficient of linear thermal expansion (CLTE) of about $11 \times 10^{-6}$ m/(mK). CLTE is a material property that is indicative of the extent to which a material expands upon heating. The CLTE of the body 58 of the vehicle 14 may affect components coupled to the body 58, such as, for example, the lighting assembly 10.

Figure 5:
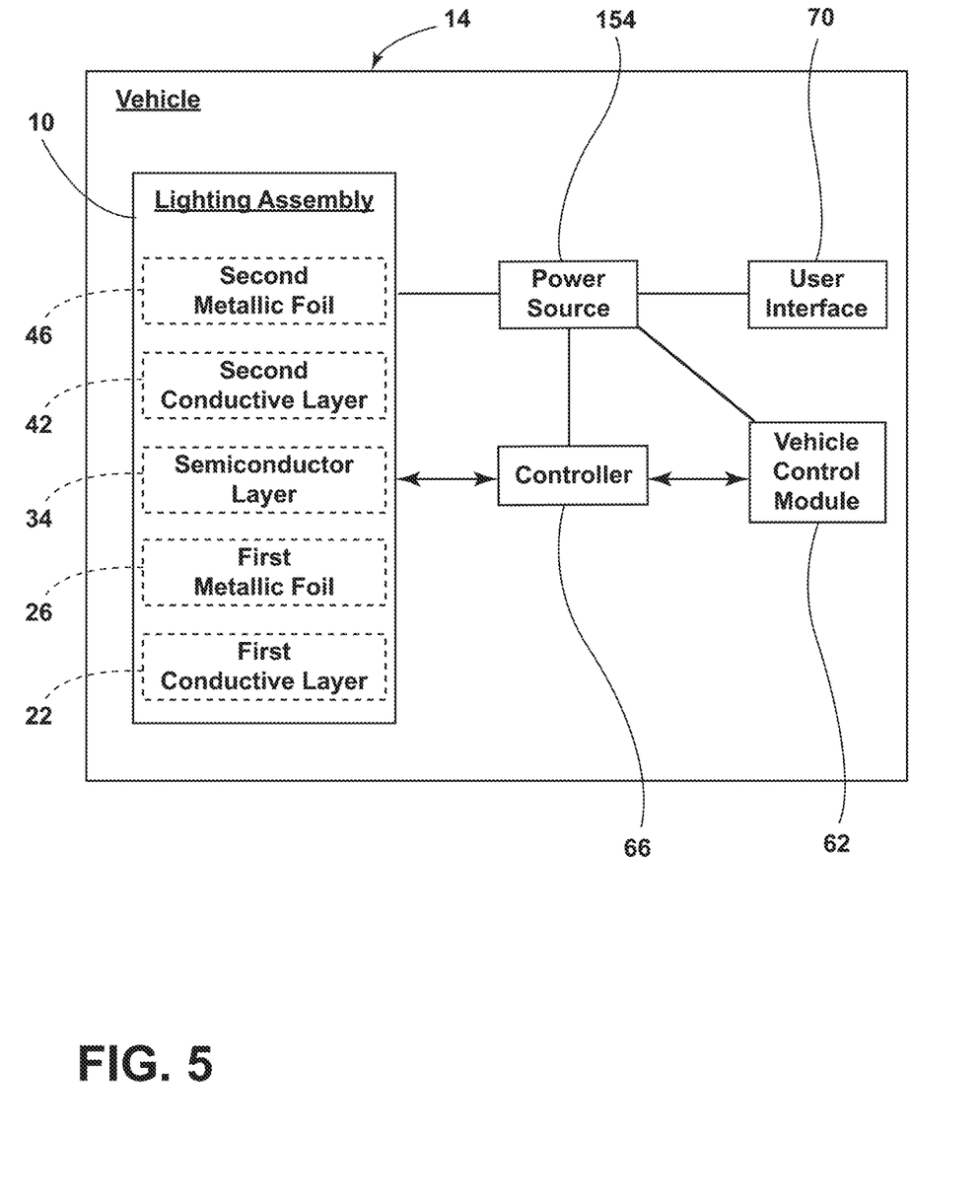
FIG. 5 is a block diagram of the vehicle, according to one example.

In various examples, the vehicle 14 includes a vehicle control module 62, which controls various electrical systems and subsystems within the vehicle 14. As a non-limiting example, the vehicle control module 62 may be configured to operate the vehicle 14 in an autonomous driving state. In other words, the vehicle 14 may not have a human driver when in the autonomous vehicle state. It is contemplated that the vehicle 14 may be switched between operating in the autonomous driving state and a manual driving state (e.g., with a human driver) without departing from the teachings herein. The vehicle 14 may switch between the autonomous driving state and the manual driving state based on information received by the vehicle control module 62 from a controller 66 (FIG. 5) and/or a user-interface 70 (FIG. 5).

In various examples, the lighting assembly 10 may be formed as a lighting strip that extends around the body 58 of the vehicle 14. It is also contemplated that the lighting assembly 10 may include multiple lighting strips positioned on the vehicle 14. The lighting assembly 10 may be positioned on the body 58 of the vehicle 14 above a door opening 74 and/or a window opening 78 proximate to a roof 82 of the vehicle 14. The lighting assembly 10 may be coupled to the vehicle via, for example, adhesive. The lighting assembly 10 may extend around an entire perimeter of the vehicle 14. It may be advantageous to position the lighting assembly 10 proximate the roof 82 and extend around the perimeter of the vehicle 14 so the lighting assembly 10 may be visible to pedestrians and/or other vehicle drivers and/or occupants for about 360° around the vehicle 14.

Referring now to FIG. 2, the lighting assembly 10 includes the polymeric layer 18. The polymeric layer 18 may be coupled to the body 58 of the vehicle 14 (FIG. 1) and operate as a base for the lighting assembly 10. The polymeric layer 18 may be a monolithic block, film, or other thin sheet on which other components of the lighting assembly 10 are printed or otherwise positioned on. In various examples, the polymeric layer 18 may include poly ether ether ketone (PEEK). It may be advantageous to include a PEEK polymeric layer 18 is the lighting assembly 10 as PEEK is a dimensionally and/or thermally stable material. PEEK films and/or layers have a CLTE of about $25 \times 10^{-6}$ m/(mK) when operating in a temperature range of from about 0° C. to about 130° C. It may be further advantageous to include PEEK in the polymeric layer 18 to reduce the overall CLTE of the lighting assembly 10. It is also contemplated that the polymeric layer 18 may also be formed from other optically transparent or translucent material such as polymethylmethacrylate, nylon, polycarbonate, polyester, polyvinyl chloride, polyethylene terephthalate (PET), polyamide-imides, or combinations thereof. It may be advantageous to include a material in the polymeric layer 18 that can withstand the heat from injection molding processes. Additionally, the polymeric layer 18 may be reinforced with a material that is not optically transparent or translucent. In various examples, the polymeric layer 18 may be reinforced with other plastic films such as, for example, polyphenylene sulfide (PPS).

The first conductive layer 22 may be coupled to the polymeric layer 18. The first conductive layer 22 may be printed, deposited, adhered, or otherwise applied to the polymeric layer 18. The first conductive layer 22 may be a transparent conductive oxide, a transparent conductive ink, or a semi-transparent conductive ink. In transparent conductive oxide examples, the first conductive layer 22 may include indium tin oxide, aluminum doped zinc oxide, barium stannate, indium zinc oxide, other transparent conductive oxides, and/or combinations thereof. In semi-transparent conductive oxide examples, the first conductive layer 22 may include silver inks, poly(3,4-ethylenedioxythiophene) (PEDOT), graphene, other conductive oxides, and/or combinations thereof. The first conductive layer 22 may, in various examples, include a metal mesh (e.g., silver nanowires) in a random or ordered orientation. The first conductive layer 22 may have a width that is less than a width of the polymeric layer 18 such that opposing edges 86 (FIG. 3) of the polymeric layer 18 are exposed (e.g., not covered by the first conductive layer 22). In other words, the polymeric layer 18 may extend a greater width in the lighting assembly 10 compared to the first conductive layer 22. In various examples, the first conductive layer 22 may define a plurality of first layer apertures 90 to accommodate the overmold 54.

The first metallic foil 26 may be coupled to the first conductive layer 22. The first metallic foil 26 may be applied to the first conductive layer 22 via overmolding, injection molding, or otherwise applied to the first conductive layer 22. In various examples, the first metallic foil 26 may include, for example, copper. Copper has a CLTE of about $16 \times 10^{-6}$ m/(mK). It may be advantageous to have the first metallic foil 26 include copper as the CLTE of copper is more similar to that of the steel of the body 58 of the vehicle 14 (FIG. 1) compared to the polymeric layer 18. Accordingly, the copper first metallic foil 26 may be advantageous to reduce the CLTE of the lighting assembly 10 and thereby increase the dimensional and/or thermal stability of the lighting assembly 10. It is also contemplated that the first metallic foil 26 may include, for example, aluminum or other similar metals and/or metal alloys. In various examples, the first metallic foil 26 may include the plurality of first foil apertures 30. The first foil apertures 30 may vertically align with the plurality of first layer apertures 90 of the first conductive layer 22.

Referring still to FIG. 2, the semiconductor layer 34 may be coupled to the first metallic foil 26. The semiconductor layer 34 may have a width less than the width of the polymeric layer 18, thereby exposing the opposing edges 86 (FIG. 3) of the polymeric layer 18. According to various examples, the semiconductor layer 34 may include a plurality of quantum dots or perovskites 38 configured to emit light. In various examples, the lighting assembly 10 may include tripod quantum dots. As used herein, a perovskite 38 is any material with the same type of crystal structure as calcium titanium oxide ($CaTiO_3$) or $^{XII}A^{2+VI}B^{4+}X^{2-}{}_3$ with an oxygen atom in the face centers of the crystal. The general chemical formula for perovskite compounds is $ABX_3$, where A and B are two cations of very different sizes, and X is an anion that bonds to both. According to various examples, the A atoms are larger than the B atoms. According to various examples, a preferred cubic-symmetry structure has the B cation in 6-fold coordination, surrounded by an octahedron of anions, and the A cation in 12-fold cuboctahedral coordination.

The perovskite 38 examples of the semiconductor layer 34 are configured to emit light 98 in response to receiving electrical energy (i.e., in the form of current or voltage) from the first and second conductive layers 22, 42. In other words, the semiconductor layer 34 is configured to emit light 98 in response to an electrical potential being generated between the first and second conductive layers 22, 42. It will be understood that the perovskites 38 of the semiconductor layer 34 may emit light 98 in response to other forms of energy received without departing from the teachings provided herein. The perovskites 38 may tightly confine either electrons or electron holes in all three spatial dimensions and may be photoluminescent. Perovskites 38 may have a radius, or a distance half of their longest length, in the range of between about 1 nm and about 10 nm, or between about 2 nm and about 6 nm. Larger perovskites 38 (e.g., radius of from about 5 nm to about 6 nm) may emit longer wavelength light 98 resulting in the color of the light being such colors as orange or red. Smaller perovskites 38 (e.g., radius of from about 2 nm to about 3 nm) may emit shorter wavelength light 98 resulting in colors such as blue and green. Exemplary compositions of the perovskites 38 may include $LaF_3$ nanocrystals that are doped (e.g., coated) with Yb—Er, Yb—Ho and/or Yb—Tm. In yet other examples, the perovskites 38 may be CsPb crystals including Cl, Br, I and may generally have the formula $CsPb(Cl/Br)_2$, $CsPbBr_3$, $CsPb(I/Br)_3$ and/or $CsPbI_3$. In yet other examples, the perovskites 38 may include In, Sn, Cd, I, InP/ZnS and/or CuInS/ZnS. It will be understood that other types of perovskites 38 may be utilized.

In various examples, the perovskites 38 may have an emission line width of about 100 nm or less, about 95 nm or less, about 90 nm or less, about 85 nm or less, about 80 nm or less, about 75 nm or less, about 70 nm or less, about 65 nm or less, about 60 nm or less, about 55 nm or less, about 50 nm or less, about 45 nm or less, about 40 nm or less, about 35 nm or less, about 30 nm or less, about 25 nm or less, about 20 nm or less, about 15 nm or less, about 10 nm or less, about 5 nm or less or any and all values and ranges there between.

The perovskites 38 may be introduced into the semiconductor layer 34 in a variety of manners. In a first method, the perovskites 38 may be blended directly into a binder. Next, the mixture of the perovskites 38 and the binder may be extruded into the semiconductor layer 34 and positioned on the lighting assembly 10. Another exemplary method of coupling the perovskites 38 and the semiconductor layer 34 is to apply a thin coating of the perovskites 38 to a surface of the semiconductor layer 34. To do this, the perovskites 38 are first blended into a polymer or a polymerizable mixture of monomers. Next, the mixture is then spin coated, ink jetted, screen printed and/or otherwise applied as a thin layer over a surface of the semiconductor layer 34. Monomer mixtures can be polymerized (cured) on the surface after application. Using this approach, it may be important to assure that the polymer or monomer mixture is lipophilic (non-polar) if organic soluble perovskites 38 are being used. Conversely, if water-soluble perovskites 38 are being used, the polymer or monomers may be hydrophilic (water soluble). It will be understood that various inks, dyes, pigments or colorants may be added to the perovskites 38. In various examples, the semiconductor layer 34 defines a plurality of semiconductor layer apertures 102 to accommodate the overmold 54. The semiconductor layer apertures 102 may be vertically aligned within the lighting assembly 10 with the first layer apertures 90 and/or the first foil apertures 30 of the first conductive layer 22 and first metallic foil 26, respectively.

Still referring to FIG. 2, the perovskites 38 may be applied as an aqueous, liquid, paste and/or powder form to a dielectric layer 106. According to various examples, the dielectric layer 106 may be coupled to the semiconductor layer 34. The dielectric layer 106 may be positioned between the first and second conductive layers 22, 42. It is contemplated that the dielectric layer 106 may be positioned above, below, or integrally defined with the semiconductor layers 34. The dielectric layer 106 may include silicon monoxide, silicon dioxide, silicon nitride, alkali halides (e.g., rubidium bromide, lithium fluoride, etc.), barium titanate, other dielectrics, and/or combinations thereof. The dielectric layer 106 may be a monolithic block, film, or other thin sheet. Further, the dielectric layer 106 may be printed, deposited, adhered, or otherwise applied to the first conductive layer 22 and/or the semiconductor layer 34. The dielectric layer 106 may have width less than the width of the polymeric layer 18. As such, the opposing edges 86 (FIG. 3) of the polymeric layer 18 may be exposed. In various examples, the dielectric layer 106 defines a plurality of dielectric layer apertures 110.

The dielectric layer apertures 110 may be vertically aligned within the lighting assembly 10 with the first layer apertures 90, the first foil layer apertures 30, and/or the semiconductor layer apertures 102.

The second conductive layer 42 may be coupled to the dielectric layer 106 and/or the semiconductor layer 34. According to various examples, the second conductive layer 42 may be printed, deposited, adhered, or otherwise applied to the dielectric layer 106 and/or the semiconductor layer 34. The second conductive layer 42 may be integrally formed with the semiconductor layer 34 such that the perovskites 38 may be applied as an aqueous, liquid, paste and/or powder form to the second conductive layer 42. The second conductive layer 42 may be a transparent conductive oxide, a transparent conductive ink, or a semi-transparent conductive ink. In transparent conductive oxide examples, the second conductive layer 42 may include indium tin oxide, aluminum doped zinc oxide, barium stannate, indium zinc oxide, other transparent conductive oxides and/or combinations thereof. It may be advantageous for the second conductive layer 42 to be a transparent conductive oxide to allow the light 98 emitted from the semiconductor layer 34 to be visible through the second conductive layer 42. In semi-transparent conductive oxide examples, the second conductive layer 42 may include silver inks, poly(3,4-ethylenedioxythiophene) (PEDOT), graphene, other conductive oxides, and/or combinations thereof. The second conductive layer 42 may, in various examples, include a metal mesh (e.g., silver nanowires) in a random or ordered orientation. In some examples, the first and second conductive layers 22, 42 may include the same materials, and in other examples the first and second conductive layers 22, 42 may include different materials. The second conductive layer 42 may have a width less than the width of the polymeric layer 18, similar to the first conductive layer 22. In various examples, the second conductive layer 42 defines a plurality of second layer apertures 114. The second layer apertures 114 may be vertically aligned with the dielectric layer apertures 110, the semiconductor layer apertures 102, the first foil layer apertures 30, and/or the first layer apertures 90.

Referring still to FIG. 2, the second metallic foil 46 is coupled to the second conductive layer 42. The second metallic foil 46 may be applied to the second conductive layer 42 via overmolding, injection molding, or otherwise applied to the second conductive layer 42. In various examples, the second metallic foil 46 may include, for example, copper. It is also contemplated that the second metallic foil 46 may include aluminum or other similar metals and/or metal alloys. In some examples, the first and second metallic foils 26, 46 may include the same materials, and in other examples the first and second metallic foils 26, 46 may include different materials. It may be advantageous for the first and/or second metallic foils 26, 46 to include copper to reduce the CLTE of the lighting assembly 10. Reducing the CLTE of the lighting assembly 10 to be more similar to the CLTE of steel (e.g., the body 58 of the vehicle 14) may minimize the thermal expansion and/or contract lighting assembly 10 due to change in temperature (e.g., heat from the sun and/or freezing weather), and thereby prolonging the use of the lighting assembly 10. In various examples, the second metallic foil 46 may define the second foil apertures 50. The second foil apertures 50 may vertically align with the first foil apertures 30, the first layer apertures 90, the second layer apertures 114, the semiconductor layer apertures 102 and/or the dielectric layer apertures 110 such that channels 118 are formed in the lighting assembly 10. The channels 118 may allow the polymeric layer 18 to be exposed to the overmold 54.

The overmold 54 may be coupled to the second metallic foil 46 and/or the second conductive layer 42. The overmold 54 may be optically transparent or translucent. The overmold 54 may protect the first and second conductive layers 22, 42, semiconductor layer 34, first and second metallic foils 26, 46, and/or the polymeric layer 18 from physical and chemical damage arising from environmental exposure. The overmold 54 may have viscoelasticity (i.e., having both viscosity and elasticity), a low Young's modulus, and/or a high failure strain so that the overmold 54 may protect the first and second conductive layers 22, 42, semiconductor layer 34, first and second metallic foils 26, 46, and/or the polymeric layer 18 when contact is made thereto. The overmold 54 may further be resistant to ultraviolet light provided by natural light source(s) and substantially resistant to weathering. The overmold 54 may also prove a styled surface feature for the lighting assembly 10. The overmold 54 may include, for example, acrylic, polycarbonate, or other clear plastics, and/or combinations thereof. It may be advantageous to include acrylic in the overmold 54 as acrylic is optically transparent, capable of being molded, and substantially scratch-resistant. However, acrylic has a CLTE of about $65\times10^{-6}$ m/(mK), which is substantially higher than the CLTE of steel. The overmold 54 may contact the first and/or second metallic foils 26, 46 by extending through the first foil apertures 30 and/or the second foil apertures 50 to reduce the CLTE of the overmold 54. Further, the overmold 54 extending through the first foil apertures 30 and/or the second foil apertures 50 may improve the interface and/or bond between the overmold 54 and the first and/or second metallic foils 26, 46.

As illustrated in FIG. 2, the overmold 54 extends through the channels 118 defined by the second foil apertures 50, the second layer apertures 114, the dielectric layer apertures 110, the semiconductor layer apertures 102, the first layer apertures 90, and the first foil apertures 30. In other words, the overmold 54 extends through the channels 118 to contact the polymeric layer 18.

Referring now to FIG. 3, the lighting assembly 10 is illustrated having the overmold 54, the dielectric layer 106, and the second conductive layer 42 removed, thereby showing the second metallic foil 46 and the semiconductor layer 34. As illustrated, the second metallic foil 46 includes opposing second foil edge portions 122. The opposing second foil edge portions 122 of the second metallic foil 46 are spaced apart and positioned proximate the opposing edges 86 of the polymeric layer 18. The opposing second foil edge portions 122 of the second metallic foil 46 may form strips that extend a length of the lighting assembly 10. The opposing second foil edge portion 122 may be positioned on first and second sides 126, 130 of the lighting assembly 10. The opposing second foil edge portions 122 may each define the second foil apertures 50. The second foil apertures 50 may be spaced apart at uniform intervals, such that the overmold 54 may contact the polymeric layer 18 at uniform intervals to reduce the CLTE of the overmold 54. The second foil apertures 50 may also extend in a linear fashion across center portions 132 of the opposing second foil edge portions 122 of the second metallic foil 46. It is also contemplated that the first metallic foil 26 includes opposing first foil edge portions 134 that are substantially similar to the opposing second foil edge portions 122. It is further contemplated that the opposing first foil edge portion 134 may be positioned parallel to the opposing second foil edge 122 and be positioned proximate the opposing edges 86 of the polymeric layer 18.

Referring now to FIGS. 2 and 3, each of the first and second conductive layers 22, 42, the dielectric layer 106, the semiconductor layer 34, and the first and second metallic foils 26, 46 may have a width less than the width of the polymeric layer 18. Accordingly, the opposing edges 86 of the polymeric layer 18 may not be covered by the first and second conductive layers 22, 42, the dielectric layer 106, the semiconductor layer 34, and the first and second metallic foils 26, 46. As such, the overmold 54 may extend towards the polymeric layer 18 and contact the polymeric layer 18 at the opposing edges 86. In other words, the overmold 54 may contact that polymeric layer 18 through the channels 118 and at the opposing edges 86 of the polymeric layer 18.

In various examples, each of the first and second conductive layers 22, 42, the dielectric layer 106, the semiconductor layer 34, and the first and second metallic foils 26, 46 may cooperate to form the channels 118 on the first and second sides 126, 130 of the lighting assembly 10. As such, the first layer apertures 90, the first foil apertures 30, the semiconductor layer apertures 102, the dielectric layer apertures 110, the second layer apertures 114, and the second foil apertures 50 may each extend along the first and second sides 126, 130 of the lighting assembly 10.

Figure 4:
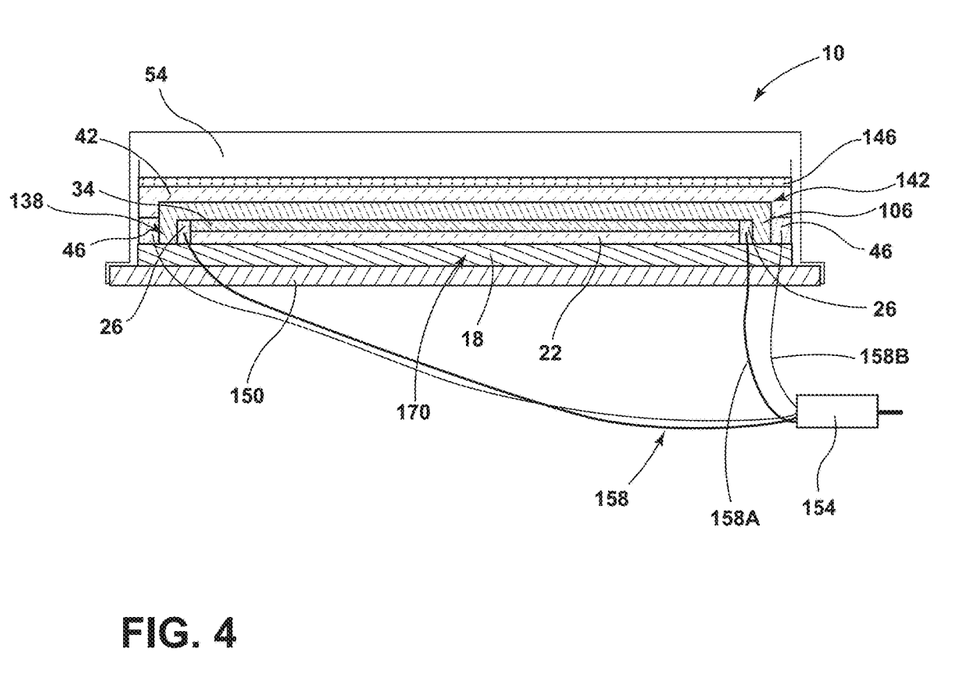
FIG. 4 is a cross-sectional view taken at line IV-IV of FIG. 1 of the lighting assembly, according to one example.

Referring now to FIG. 4, the first and second metallic foils 26, 46 may be aligned horizontally, such that both the first and second metallic foils 26, 46 are positioned on the polymeric layer 18. In such an example, as illustrated in FIG. 4, the second metallic foil 46 is positioned proximate the opposing edges 86 of the polymeric layer 18. The first metallic foil 26 is positioned to an interior of and spaced apart from the second metallic foil 46. In various examples, the first and second metallic foils 26, 46 may include the first and second foil edge portions 122, 134, respectively, positioned on the first and second sides 126, 130 of the lighting assembly 10. The first metallic foil 26 may operate as a ground circuit and/or ground trace, and the second metallic foil 46 may operate as a power circuit and/or power trace.

The first conductive layer 22 may be coupled to the polymeric layer 18 and positioned between the first foil edge portions 134. The first conductive layer 22 may abut the first foil edge portions 134 and operate to carry a ground current through the lighting assembly 10. The semiconductor layer 34 may be coupled to the first conductive layer 22. In various examples, the first and second metallic foils 26, 46 have a height substantially similar to the combined height of the first conductive layer 22 and the semiconductor layer 34. The dielectric layer 106, as illustrated, is coupled to the semiconductor layer 34 and extends over the first foil edge portions 134. The dielectric layer 106 extends downwards into an opening 138 formed between the first and second foil edge portions 122, 134, respectively. As such, the dielectric layer 106 contacts the polymeric layer 18. The second conductive layer 42 may be coupled to the dielectric layer 106 and around outer end portions 142 of the dielectric layer 106 to contact the second foil edge portions 122.

Still referring to FIG. 4, a protective coating 146 may be coupled to the second conductive layer 42. The protective coating 146 may be transparent and/or optically clear. As used herein, the term "optically clear" refers to a layer and/or coating that may have a high light transmittance over at least a portion of the visible light spectrum (about 400 to about 700 nanometers), and that exhibits low haze. Both the luminous transmission and the haze can be determined using, for example, the method of ASTM-D 1003-95. The protective coating 146 may be advantageous to protect the second conductive layer 42 from damage. Further, the protective coating 146 may be advantageous to compatibilize components of the lighting assembly 10 to the material and/or polymer of the overmold 54. For example, if the overmold 54 includes acrylic, the protective coating 146 may include acrylic as acrylic bonds well to acrylic. In other examples, if the overmold 54 includes other plastics and/or polymers, the protective coating 146 may include plastics and/or polymers that bond well to the overmold 54. As illustrated, the overmold 54 is coupled to the protective coating 146 and extend downwards on the first and second sides 126, 130 of the lighting assembly 10 to contact the opposing edges 86 of the polymeric layer 18. It is also contemplated that the overmold 54 may extend through the opening 138 defined by the first and second foil edge portions 122 on the first and second sides 126, 130 of the lighting assembly 10, respectively, to contact the polymeric layer 18.

The lighting assembly 10 may also include a cover 150 coupled to the polymeric layer 18. The cover 150 may be configured to couple to the body 58 of the vehicle 14 (FIG. 1). The overmold 54 may also be coupled to the cover 150 proximate the polymeric layer 18. The cover 150 may include plastics or other similar polymers. The cover 150 may be coupled to the overmold 54 via adhesives or may be sonic or laser welded to the overmold 54. The cover 150 may include potting compounds such as, for example, silicone, acrylic, epoxy, or other similar materials. In various examples, the lighting assembly 10 may be encapsulated with the potting compound. The potting compound may be advantageous for resistance to shock and vibration and for exclusion of moisture and corrosive agents.

Referring to FIGS. 1 and 4, as illustrated, the first and second foil edge portions 122, 134 are coupled to a power source 154 via an electrical connection 158. The electrical connection 158 may be, for example, wires 158A, 158B, which may extend from the power source 154 to the lighting assembly 10. In various examples, the electrical connection 158 may extend through an A-pillar 162 of the vehicle 14. It is contemplated the electrical connection 158 may also extend through the B-pillar, C-pillar, and/or D-pillar of the vehicle 14. The second metallic foil 46 may carry the positive voltage through the lighting assembly 10, and the first metallic foil 26 may carry negative voltage to complete the electrical circuit. Use of the first and/or second metallic foils 26, 46 may be advantageous to maintain the brightness of the light 98 emitted across the lighting assembly 10. The first and second conductive layers 22, 42 may generate electrical potential, which may activate the semiconductor layer 34. Once activated, the semiconductor layer 34 may be configured to emit light 98.

Referring to FIGS. 4 and 5, the lighting assembly 10 may be installed as a single strip on the vehicle 14. The vehicle 14 may be operable in both the autonomous driving state and the manual driving state. A user may activate the autonomous driving state. The user may activate the autonomous driving state and/or the lighting assembly 10 via the user-interface 70. Accordingly, the user-interface 70 may be in communication with the vehicle control module 62 and/or the controller 66. In various examples, the user-interface 70 may be in an interior 166 of the vehicle 14, such as, for example, a display screen, or may be outside the vehicle 14, such as, for example, a key fob. The vehicle control module 62 may be configured to detect when the vehicle 14 is operating in the autonomous driving state and, in response, send a signal to the controller 66. When the controller 66 receives the signal that the vehicle 14 is operating in the autonomous vehicle state, the controller 66 may activate the lighting assembly 10. Accordingly, when the lighting assembly 10 is activated, the vehicle 14 may indicate to other drivers and/or pedestrians that the vehicle 14 is in an autonomous driving state and, therefore, may not have a human driver. In various examples, there may be a single electrical connection 158 between the power source 154 and the lighting assembly 10. In other examples, there may be more than one electrical connection 158 between the lighting assembly 10 and the power source 154. The power source 154 may also be coupled to the vehicle control module 62, the controller 66, and/or the user-interface 70. The power source 154 may be, for example, a vehicle battery. The vehicle control module 62 may be configured to detect when the vehicle 14 is no longer in the autonomous driving state (e.g., the vehicle 14 is in the manual driving state and/or off). The vehicle control module 62 may send a signal to the controller 66 indicating that the vehicle 14 is not in the autonomous driving state. The controller 66 may then deactivate the lighting assembly 10.

Figure 6:
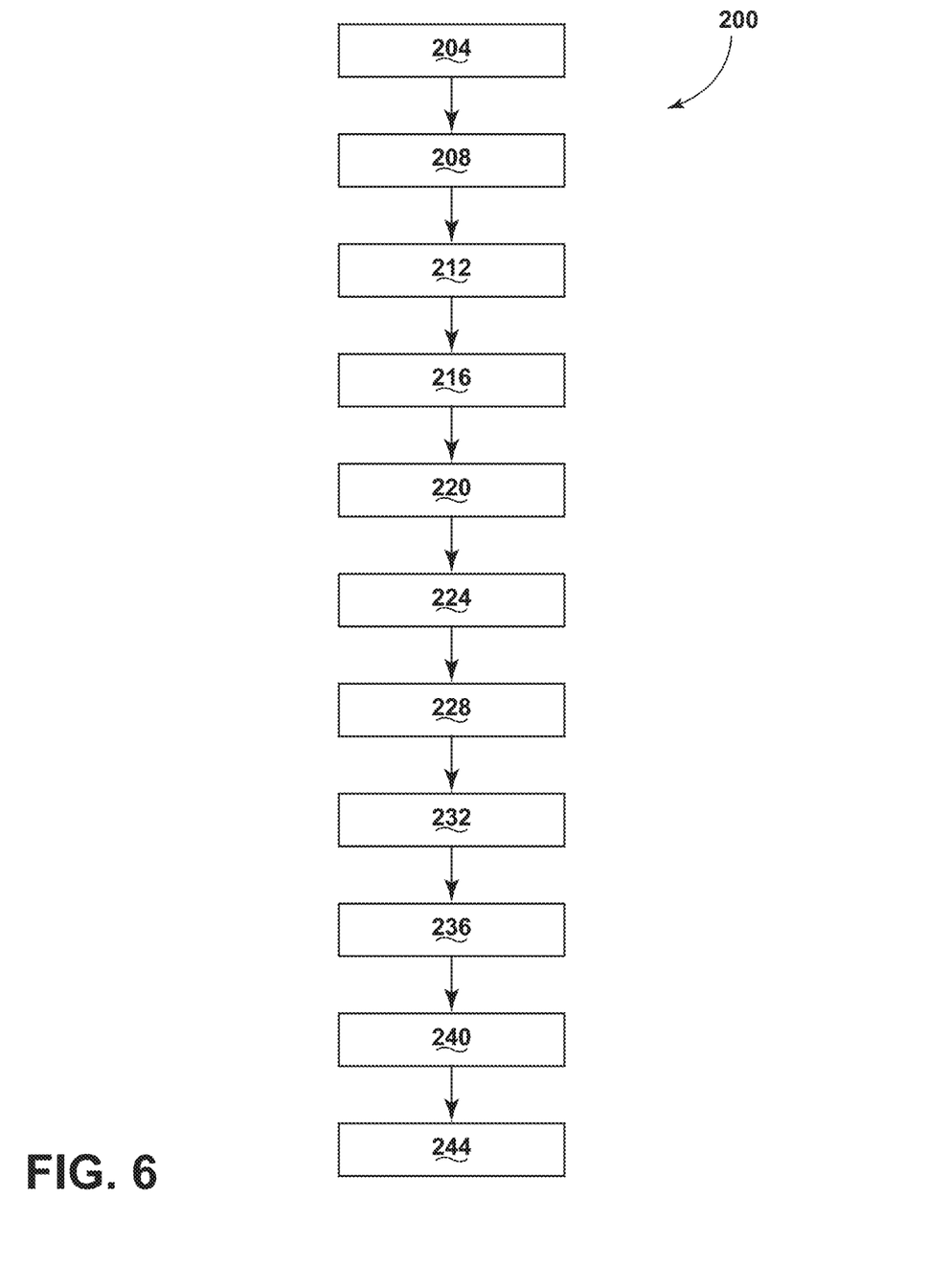
FIG. 6 is a flow chart of a method of manufacturing the lighting assembly, according to one example.

Referring now to FIG. 6, a method 200 for manufacturing the lighting assembly 10 may include a step 204 of extruding the first and/or second metallic foils 26, 46. Extruding may force the material of the first and/or second metallic foils 26, 46 to flow through a die of a smaller cross-sectional area to produce a desired cross section. The step 204 may also include extruding the polymeric layer 18 to form the polymeric layer into a desired cross section.

The method 200 may include a step 208 of printing the polymeric layer 18. The polymeric layer 18 may be printed using, for example, a roll-to-roll 3D laser printer designed to print 3D circuits and masks. The polymeric layer 18 may also be printed using, for example, other 3D laser printers, silk-screening, or other film printers. The step 208 may include positioning and/or loading the polymeric layer 18 into a 3D printer for printing other components of the lighting assembly 10.

A next step 212 of the method 200 may include printing the first conductive layer 22 on the polymeric layer 18. The first conductive layer 22 may be printed across the entire width of the polymeric layer or along the width portion of the polymeric layer 18. In various examples, the first conductive layer 22 may be printed on a central portion 170 of the polymeric layer, leaving the opposing edges 86 of the polymeric layer 18 uncovered. The step 212 may also include grounding the first conductive layer 22.

A step 216 of the method 200 may include coupling the first and/or second metallic foils 26, 46 to the polymeric layer 18. The step 216 may include overmolding and/or bonding the first and second metallic foils 26, 46 to the polymeric layer 18. The step 216 may also include printing ground traces and mating the ground traces against a length of the first conductive layer 22. Power traces may also be printed proximate the ground traces. The power traces may extend a length of the lighting assembly 10. The ground traces and power traces may be spaced apart to provide insulation for the ground and power traces.

The method 200 may include a step 220 of printing the semiconductor layer 34 on the first conductive layer 22. In various examples, the step 220 may include printing the semiconductor layer 34 which may be printed proximate the central portion 170 of the polymeric layer 18 and abut the first metallic foil 26.

A step 224 may include printing the dielectric layer 106 on the semiconductor layer 34. In various examples, the dielectric layer may be printed over the entire width of the semiconductor layer 34 and extend over the second metallic foil 46. The step 224 may also include printing the dielectric layer 106 into the opening 138 between the first and second foil edge portions 122 of the first and second metallic foils 26, 46, respectively.

The method 200 may include a next step 228 of printing the second conductive layer 42 on the dielectric layer 106. The second conductive layer 42 may be printed to extend a similar width as the polymeric layer 18. As illustrated, the second conductive layer 42 is printed over the dielectric layer and printed over the outer end portions 142 of the dielectric layer 106 to contact the second metallic foil 46.

Further, the method 200 may include a step 232 of applying the protective coating 146 to the second conductive layer 42. The protective coating 146 may be printed over the entire width of the second conductive layer 42.

The method 200 may also include a step 236 molding the overmold 54 over the protective coating 146 and/or the second conductive layer 42. The step 236 may also include placing the lighting assembly 10 in an injection mold for molding the overmold 54 over the lighting assembly 10. The step 236 may also include molding the overmold 54 over the first and second sides 126, 130 of the lighting assembly 10 such that the overmold extends to the polymeric layer 18. In various examples, the overmold 54 may be molded through the channels 118 defined by the second foil apertures 50, the second layer apertures 114, the dielectric layer apertures 110, the semiconductor layer apertures 102, the first layer apertures 90, and the first foil apertures 30 to contact the polymeric layer 18.

A step 240 may include coupling the wires 158A, 158B to the first and second metallic foils 26, 46. In various examples, wires 158A may be coupled to the first foil edge portions 134 to provide the ground current. The wires 158B may be coupled to the second foil edge portions 122 to provide the power current. The wires 158A, 158B provide the electrical connection 158 between the lighting assembly 10 and the power source 154.

A next step 244 of the method 200 may include welding and/or coupling the cover 150 to the overmold 54 proximate the polymeric layer 18. The step 244 may also include coupling the cover to the polymeric layer 18 on a side opposing the first conductive layer 22. The cover 150 may be sonic or laser welded to the overmold 54. In various examples, the cover 150 may be coupled to the overmold 54 via adhesives. The step 244 may also include applying a potting compound to the lighting assembly 10. The potting compound may be applied to the polymeric layer 18 and/or encapsulate the lighting assembly 10.

Use of the present disclosure may provide a variety of advantages. For example, use of the presently disclosed lighting assembly 10 including the first and second metallic foils 26, 46 may reduce thermal movement of the lighting assembly 10 during thermal cycling. The lighting assembly 10 of the present disclosure may be thinner than conventional light sources and offer visual styling effects similar to conventional organic light emitting diode light sources. Further, the lighting assembly 10 may be more efficient than a conventional organic light emitting diode light sources. Additionally, the lighting assembly 10 may be formed in strips that maintain substantially the same brightness along the length of the strip.

According to various examples, a lighting assembly for a vehicle includes a polymeric layer; a first conductive layer coupled to the polymeric layer; a first metallic foil defining a plurality of first foil apertures; a semiconductor layer including a plurality of perovskites; a second conductive layer coupled to the semiconductor layer; a second metallic foil defining a plurality of second foil apertures; and a transparent overmold, wherein the transparent overmold extends through the plurality of first foil apertures, the first and second conductive layers, the semiconductor layer, and the plurality of second foil apertures to contact the polymeric layer. Embodiments of the present disclosure may include one or a combination of the following features:

the second conductive layer comprises a transparent conductive oxide;
the semiconductor layer is configured to emit light in response to an electrical potential being generated between the first and second conductive layers;
the polymeric layer comprises poly ether ether ketone;
the first and second metallic foils comprise copper;
the transparent overmold comprises acrylic;
the transparent overmold contacts opposing edges of the polymeric layer;
the polymeric layer is configured to be installed on an exterior of a vehicle;
a dielectric layer positioned adjacent to the semiconductor layer;
the transparent overmold extends through the semiconductor layer, first and second conductive layers, the plurality of first foil apertures, and the plurality of second foil apertures to contact the polymeric layer at uniform intervals;
the second metallic foil comprises opposing second foil edge portions spaced apart and positioned proximate opposing edges of the polymeric layer;
a vehicle control module configured to operate a vehicle in an autonomous driving state;
a controller configured to activate a light source in response to the autonomous driving state;
the semiconductor layer includes a plurality of printed perovskites configured to emit light;
the overmold extends through the plurality of foil apertures;
the vehicle control module is operably coupled to the controller and configured to send a signal to the controller signaling the vehicle is operating in the autonomous driving state;
the plurality of foil apertures are linearly arranged in a center portion of the metallic foil; and
the lighting assembly forms a strip and an electrical connection contacts the strip in a single location.

A method of manufacturing a lighting assembly for a vehicle includes extruding a first metallic foil and a second metallic foil. The method includes printing a polymeric layer and coupling the first and second metallic foils to the polymeric layer. A next step of printing a semiconductor layer on the first conductive layer, wherein the semiconductor includes a plurality of perovskites. A step of printing a dielectric layer on the semiconductor layer and through an opening defined by the first and second metallic foils. A step of printing a second conductive layer on the dielectric layer and over outer end portions of the dielectric layer. The method includes a step of molding an overmold over the second conductive layer. Embodiments of the present disclosure may include one or a combination of the following features and/or steps:

applying a protective coating to the second conductive layer; and
coupling a cover to the overmold proximate the polymeric layer.

Modifications of the disclosure will occur to those skilled in the art and to those who make or use the disclosure.

Therefore, it is understood that the embodiments shown in the drawings and described above are merely for illustrative purposes and not intended to limit the scope of the disclosure, which is defined by the following claims, as interpreted according to the principles of patent law, including the doctrine of equivalents.

It is to be understood that variations and modifications can be made on the aforementioned structure without departing from the concepts of the present disclosure, and further it is to be understood that such concepts are intended to be covered by the following claims unless these claims by their language expressly state otherwise.

What is claimed is:

1. A lighting assembly for a vehicle, comprising:
a polymeric layer;
a first conductive layer coupled to the polymeric layer;
a first metallic foil defining a plurality of first foil apertures;
a semiconductor layer including a plurality of perovskites;
a second conductive layer coupled to the semiconductor layer;
a second metallic foil defining a plurality of second foil apertures; and
a transparent overmold extending through the plurality of first foil apertures, the first and second conductive layers, the semiconductor layer, and the plurality of second foil apertures to contact the polymeric layer at uniform intervals.

2. The lighting assembly of claim 1, wherein the second conductive layer comprises a transparent conductive oxide.

3. The lighting assembly of claim 1, wherein the semiconductor layer is configured to emit light in response to an electrical potential being generated between the first and second conductive layers.

4. The lighting assembly of claim 1, wherein the polymeric layer comprises poly ether ether ketone.

5. The lighting assembly of claim 1, wherein the first and second metallic foils comprise copper.

6. The lighting assembly of claim 1, wherein the transparent overmold comprises acrylic.

7. The lighting assembly of claim 1, wherein the transparent overmold contacts opposing edges of the polymeric layer.

8. The lighting assembly of claim 1, wherein the polymeric layer is configured to be installed on an exterior of a vehicle.

9. The lighting assembly of claim 1, further including:
a dielectric layer positioned adjacent to the semiconductor layer.

10. The lighting assembly of claim 1, wherein the second metallic foil comprises opposing second foil edge portions spaced apart and positioned proximate opposing edges of the polymeric layer.

11. A vehicle lighting system, comprising:
a vehicle control module configured to operate a vehicle in an autonomous driving state;
a controller configured to activate a light source in response to the autonomous driving state; and
a lighting assembly forming a strip, wherein an electrical connection contacts the strip in a single location, and wherein the lighting assembly comprises:
a polymeric layer;
a semiconductor layer configured to emit light, wherein the semiconductor layer is positioned between first and second conductive layers;
a metallic foil defining a plurality of foil apertures; and an overmold extending through the plurality of foil apertures, the semiconductor layer, and the first and second conductive layers to contact the polymeric layer.

12. The vehicle lighting system of claim 11, wherein the semiconductor layer includes a plurality of printed perovskites configured to emit light.

13. The vehicle lighting system of claim 11, wherein the overmold extends through the plurality of foil apertures.

14. The vehicle lighting system of claim 11, wherein the vehicle control module is operably coupled to the controller and configured to send a signal to the controller signaling the vehicle is operating in the autonomous driving state.

15. The vehicle lighting system of claim 11, wherein the plurality of foil apertures are linearly arranged in a center portion of the metallic foil.

* * * * *